US012586658B2

(12) United States Patent
Yoo et al.

(10) Patent No.: US 12,586,658 B2
(45) Date of Patent: Mar. 24, 2026

(54) ELECTRONIC DEVICE INCLUDING DRAM AND METHOD FOR OPERATING THE SAME

(71) Applicant: Samsung Electronics Co., Ltd., Suwon-si (KR)

(72) Inventors: Jiyong Yoo, Suwon-si (KR); Eunjoon Kim, Suwon-si (KR); Heesung Lee, Suwon-si (KR); Soonyeol Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 225 days.

(21) Appl. No.: 18/596,951

(22) Filed: Mar. 6, 2024

(65) Prior Publication Data
US 2024/0304274 A1 Sep. 12, 2024

Related U.S. Application Data

(63) Continuation of application No. PCT/KR2024/002728, filed on Mar. 4, 2024.

(30) Foreign Application Priority Data

Mar. 6, 2023 (KR) ........................ 10-2023-0028931
Mar. 27, 2023 (KR) ........................ 10-2023-0039850

(51) Int. Cl.
*G11C 29/56* (2006.01)

(52) U.S. Cl.
CPC .. *G11C 29/56016* (2013.01); *G11C 29/56008* (2013.01); *G11C 29/56012* (2013.01); *G11C 2029/5604* (2013.01)

(58) Field of Classification Search
CPC ........ G11C 29/56016; G11C 29/56008; G11C 29/56012; G11C 2029/5604;
(Continued)

(56) References Cited

U.S. PATENT DOCUMENTS 10,957,414 B1    3/2021  Ahn et al.
11,483,185 B1   10/2022  Gugwad et al.
(Continued)

FOREIGN PATENT DOCUMENTS

CN        113050012 A      6/2021
CN        112328441 B      9/2022
(Continued)

OTHER PUBLICATIONS

International Search Report dated Jun. 10, 2024, issued in International Application No. PCT/KR2024/002728.

*Primary Examiner* — Amir Zarabian
*Assistant Examiner* — Minh Dinh
(74) *Attorney, Agent, or Firm* — Jefferson IP Law, LLP

(57) ABSTRACT

An electronic device is provided. The electronic device includes dynamic random access memory (DRAM), memory, and one or more processors communicatively coupled to the DRAM and the memory, wherein the memory store one or more computer programs including computer-executable instructions that, when executed by the one or more processors, cause the electronic device to generate a first eye diagram based on training the DRAM with a driving voltage, identify a first parameter in a designated format corresponding to the generated first eye diagram, generate a second eye diagram based on training the DRAM with the driving voltage, compare the identified first parameter with a second parameter in the designated format corresponding to the generated second eye diagram, and adjust the driving voltage based on a result of the comparison between the first parameter and the second parameter.

20 Claims, 10 Drawing Sheets

(58) Field of Classification Search
  CPC ............ G11C 11/4074; G11C 11/4076; G11C
                 29/023; G11C 29/021; G11C 29/028
  USPC ........................................................ 365/201
  See application file for complete search history.

(56)                    References Cited

U.S. PATENT DOCUMENTS

| | | | |
|---|---|---|---|
| 11,501,805 B2 | 11/2022 | Lee et al. | |
| 11,803,437 B1 * | 10/2023 | Willey ................. | G11C 29/022 |
| 2018/0335828 A1 | 11/2018 | Chun et al. | |
| 2021/0270888 A1 | 9/2021 | Treon et al. | |
| 2021/0302498 A1 | 9/2021 | Su et al. | |
| 2021/0349730 A1 * | 11/2021 | Lee ..................... | G06F 11/2284 |
| 2022/0310150 A1 | 9/2022 | Morimoto | |
| 2023/0032066 A1 | 2/2023 | Lin et al. | |
| 2023/0146703 A1 * | 5/2023 | Willey ................ | G06F 13/1668 |
| | | | 365/185.2 |
| 2025/0004939 A1 * | 1/2025 | He ....................... | G11C 29/022 |

FOREIGN PATENT DOCUMENTS

| | | | |
|---|---|---|---|
| CN | 115691633 A | 2/2023 |
| CN | 116148643 A | 5/2023 |
| KR | 10-2021-0026956 A | 3/2021 |
| KR | 10-2022-0086948 A | 6/2022 |

* cited by examiner

Under processing, or in use

Figure 5:
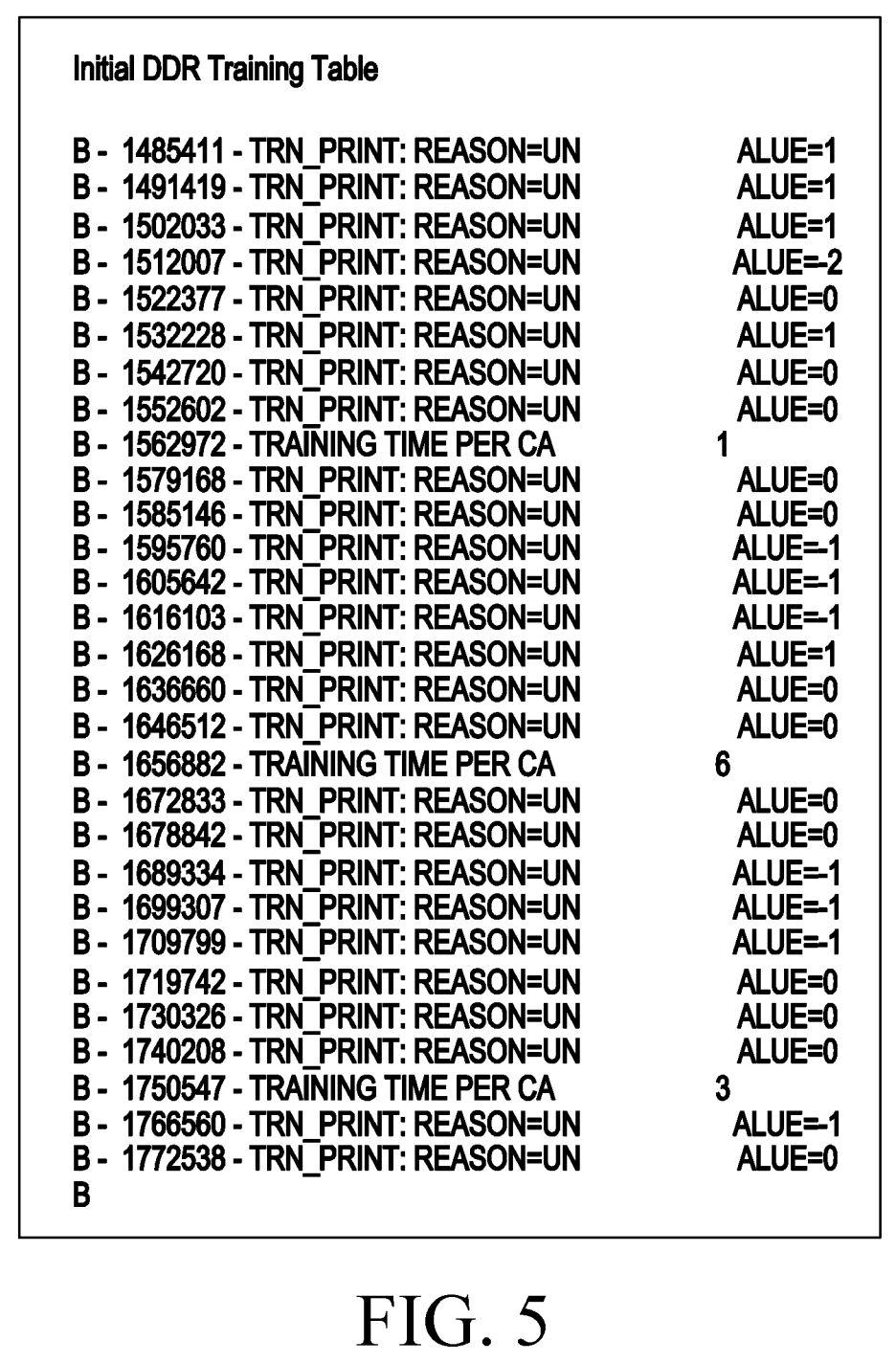

Initial DDR Training Table

```
B - 1485411 - TRN_PRINT: REASON=UN              ALUE=1
B - 1491419 - TRN_PRINT: REASON=UN              ALUE=1
B - 1502033 - TRN_PRINT: REASON=UN              ALUE=1
B - 1512007 - TRN_PRINT: REASON=UN              ALUE=-2
B - 1522377 - TRN_PRINT: REASON=UN              ALUE=0
B - 1532228 - TRN_PRINT: REASON=UN              ALUE=1
B - 1542720 - TRN_PRINT: REASON=UN              ALUE=0
B - 1552602 - TRN_PRINT: REASON=UN              ALUE=0
B - 1562972 - TRAINING TIME PER CA         1
B - 1579168 - TRN_PRINT: REASON=UN              ALUE=0
B - 1585146 - TRN_PRINT: REASON=UN              ALUE=0
B - 1595760 - TRN_PRINT: REASON=UN              ALUE=-1
B - 1605642 - TRN_PRINT: REASON=UN              ALUE=-1
B - 1616103 - TRN_PRINT: REASON=UN              ALUE=-1
B - 1626168 - TRN_PRINT: REASON=UN              ALUE=1
B - 1636660 - TRN_PRINT: REASON=UN              ALUE=0
B - 1646512 - TRN_PRINT: REASON=UN              ALUE=0
B - 1656882 - TRAINING TIME PER CA         6
B - 1672833 - TRN_PRINT: REASON=UN              ALUE=0
B - 1678842 - TRN_PRINT: REASON=UN              ALUE=0
B - 1689334 - TRN_PRINT: REASON=UN              ALUE=-1
B - 1699307 - TRN_PRINT: REASON=UN              ALUE=-1
B - 1709799 - TRN_PRINT: REASON=UN              ALUE=-1
B - 1719742 - TRN_PRINT: REASON=UN              ALUE=0
B - 1730326 - TRN_PRINT: REASON=UN              ALUE=0
B - 1740208 - TRN_PRINT: REASON=UN              ALUE=0
B - 1750547 - TRAINING TIME PER CA         3
B - 1766560 - TRN_PRINT: REASON=UN              ALUE=-1
B - 1772538 - TRN_PRINT: REASON=UN              ALUE=0
B
```

ELECTRONIC DEVICE INCLUDING DRAM AND METHOD FOR OPERATING THE SAME

CROSS-REFERENCE TO RELATED APPLICATION(S)

This application is a continuation application, claiming priority under § 365(c), of an International application No. PCT/KR2024/002728, filed on Mar. 4, 2024, which is based on and claims the benefit of a Korean patent application number 10-2023-0028931, filed on Mar. 6, 2023, in the Korean Intellectual Property Office, and of a Korean patent application number 10-2023-0039850, filed on Mar. 27, 2023, in the Korean Intellectual Property Office, the disclosure of each of which is incorporated by reference herein in its entirety.

TECHNICAL FIELD

The disclosure relates to an electronic device including dynamic random access memory (DRAM) and a method for operating the same.

BACKGROUND ART

Electronic devices may use dynamic random access memory (DRAM) as a semiconductor memory module. DRAM exhibits better performance when the driving voltage increases but may consume less power when the driving voltage decreases. Electronic devices may drive DRAM with an appropriate driving voltage to reduce power consumption while operating normally.

DRAM installed in electronic devices may have their own defects, and may deteriorate due to stress, such as additional assembly processes while assembled in the electronic device, use of the electronic device, staying at high temperatures, or electro-static discharge (ESD).

An electronic device may use an eye diagram according to double data rate (DDR) training of DRAM to determine whether the DRAM is defective or deteriorated.

The above information is presented as background information only to assist with an understanding of the disclosure. No determination has been made, and no assertion is made, as to whether any of the above might be applicable as prior art with regard to the disclosure.

DISCLOSURE OF INVENTION

Solution to Problems

Aspects of the disclosure are to address at least the above-mentioned problems and/or disadvantages and to provide at least the advantages described below. Accordingly, an aspect of the disclosure is to provide an electronic device including DRAM and a method for operating the same.

Additional aspects will be set forth in part in the description which follows and, in part, will be apparent from the description, or may be learned by practice of the presented embodiments.

In accordance with an aspect of the disclosure, an electronic device is provided. The electronic device includes dynamic random access memory, memory storing instructions, and at least one processor. The instructions, when executed by the at least one processor, may cause the electronic device to generate a first eye diagram based on training the of DRAM with a driving voltage. The instructions, when executed by the at least one processor, may cause the electronic device to identify a first parameter in a designated format corresponding to the generated first eye diagram. The instructions, when executed by the at least one processor, may cause the electronic device to generate a second eye diagram based on training of the DRAM with the driving voltage. The instructions, when executed by the at least one processor, may cause the electronic device to compare the identified first parameter with a second parameter in the designated format corresponding to the generated second eye diagram. The instructions, when executed by the at least one processor, may cause the electronic device to adjust the driving voltage based on a result of the comparison between the first parameter and the second parameter.

In accordance with another aspect of the disclosure, a method performed by an electronic device is provided. The method includes generating a first eye diagram based on training of dynamic random access memory with a driving voltage. The method performed by the electronic device according to an embodiment may comprise identifying a first parameter in a designated format corresponding to the generated first eye diagram. The method performed by the electronic device according to an embodiment may comprise generating a second eye diagram based on training of the of DRAM with the driving voltage. The method performed by the electronic device according to an embodiment may comprise comparing the identified first parameter with a second parameter in the designated format corresponding to the generated second eye diagram. The method performed by the electronic device according to an embodiment may comprise adjusting the driving voltage based on a result of the comparison between the first parameter and the second parameter.

In accordance with another aspect of the disclosure, a non-transitory computer readable medium storing instructions that, when executed by at least one processor of an electronic device, may cause the electronic device to generate a first eye diagram based on training of DRAM with a driving voltage. The instructions, when executed by the at least one processor, may cause the electronic device to identify a first parameter in a designated format corresponding to the generated first eye diagram. The instructions, when executed by the at least one processor, may cause the electronic device to generate a second eye diagram based on training of the DRAM with the driving voltage. The instructions, when executed by the at least one processor, may cause the electronic device to compare the identified first parameter with a second parameter in the designated format corresponding to the generated second eye diagram. The instructions, when executed by the at least one processor, may cause the electronic device to adjust the driving voltage based on a result of the comparison between the first parameter and the second parameter.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which:

FIG. 5 illustrates a lookup table of a first parameter according to a first eye diagram according to an embodiment of the disclosure;

FIG. 6 illustrates a lookup table of a first parameter and a second parameter according to an embodiment of the disclosure;

Throughout the drawings, it should be noted that like reference numbers are used to depict the same or similar elements, features, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include instructions. The entirety of the one or more computer programs may be stored in a single memory or the one or more computer programs may be divided with different portions stored in different multiple memories.

Any of the functions or operations described herein can be processed by one processor or a combination of processors.

The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a micropro-cessor unit (MPU), a system on chip (SoC), an integrated circuit (IC), or the like.

Figure 1:
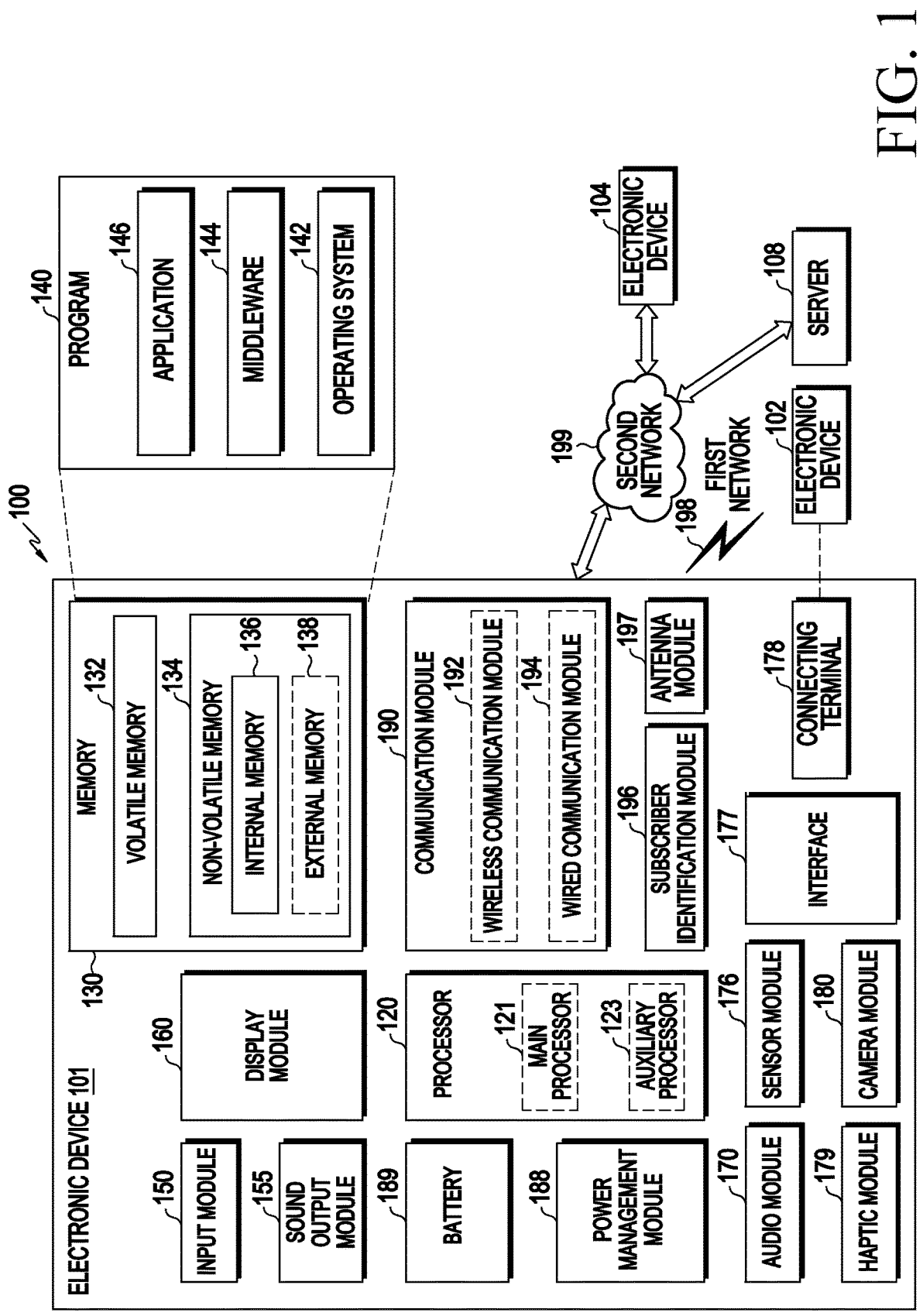
FIG. 1 is a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal According to an embodiment, the display module 160 may include a first display module 351 corresponding to the user's left eye and/or a second display module 353 corresponding to the user's right eye, a haptic module 179, a camera module 180, a power management module 188, a battery 189, a communication module 190, a subscriber identification module (SIM) 196, or an antenna module 197. In an embodiment, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may per-form various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function.

The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a fifth generation (5G) network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 decibels (dB) or less) for implementing mMTC, or U-plane latency (e.g., 0.5 milliseconds (ms) or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductive body or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to an embodiment, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

Figure 2:
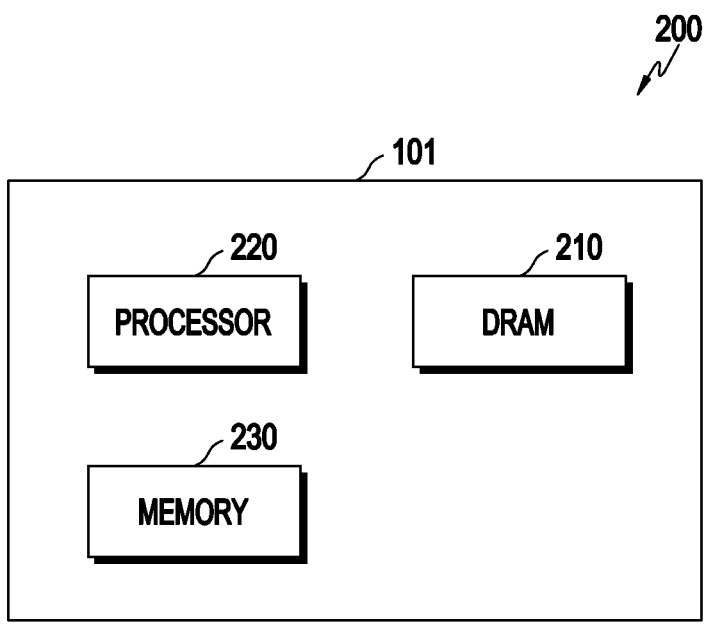
FIG. 2 is a block diagram illustrating an electronic device according to an embodiment of the disclosure.

FIG. 2 is a block diagram 200 illustrating an electronic device 101 according to an embodiment of the disclosure.

Referring to FIG. 2, the electronic device 101 according to an embodiment may include DRAM 210, memory 230, and/or a processor 220. In an embodiment, the processor 220 may be operatively connected to the DRAM 210 and/or the memory 230.

The DRAM 210 according to an embodiment of the disclosure may be random access memory (RAM), which is one of memory semiconductors used as a memory device. In an embodiment, the DRAM 210 is a device that records digital information representing 0 or 1 by the amount of charge of a capacitor, and may operate to periodically refresh data to prevent loss of data due to discharge of the amount of charge of the capacitor.

The DRAM 210 according to an embodiment may include a memory module including at least one cell each storing digital information.

The memory 230 (e.g., the memory 130 of FIG. 1) according to an embodiment may store an application, a series of operations, or data. In an embodiment, the memory 230 may be non-volatile memory (e.g., the non-volatile memory 134 of FIG. 1) in which stored data is not deleted by the user or automatically.

The processor 220 according to an embodiment may execute an application or an operation stored in the memory 230. In an embodiment, the processor 220 may control at least one other component (e.g., a hardware or software component) included in the electronic device 101, or may perform various data processing or computation.

The processor 220 according to an embodiment may further include a memory controller (not shown) and/or internal memory (not shown). In an embodiment, the processor 220 may transmit a training signal to the DRAM 210 by using a memory controller (not shown), and may generate an eye diagram of the DRAM 210 based on the transmitted training signal. In an embodiment, the processor 220 may transmit a test signal to the memory controller (not shown, e.g., a component included in the processor 220) in response to an operation of executing a training function of the DRAM 210.

In an embodiment, data related to the operation of the processor 220 including an operation of executing a training function of the DRAM 210 and an operation of adjusting a designated driving voltage may be stored in internal memory (not shown). In an embodiment, the processor 220 may receive data related to the operation of the processor 220, which includes an operation of executing a training function of the DRAM 210 and an operation of adjusting a designated driving voltage, from the outside.

For example, the training of the DRAM 210 (e.g., double data rate (DDR) training) is that the processor 220 and the DRAM 210 exchange data with each other using a memory controller (not shown), and the processor 220 may generate an optimal eye diagram according to an operating environment of a channel according to the training of the DRAM 210. In an embodiment, the generated eye diagram may be a form (e.g., a small eye diagram) in which a margin is insufficient according to a defective state of the DRAM 210.

In an embodiment, the processor 220 may transmit a test signal to the DRAM 210 using a memory controller (not shown), and may monitor a malfunction related to writing or reading of the DRAM 210 based on the transmitted test signal. For example, the test signal may refer to a signal generated by the processor 220 by loading and executing a boot loader program in the memory 230. In an embodiment, the processor 220 may be configured to transmit a test signal to the DRAM 210 based on a designated period (e.g., one day, one week, one year, or a designated period).

In an embodiment, the processor 220 may execute a test function for the DRAM 210 by executing a program corresponding to the test function of the DRAM 210 stored in the memory 230. For example, the program corresponding to the test function may be included in the boot loader program.

In an embodiment, the processor 220 may generate a first eye diagram based on training of the DRAM 210 with a designated driving voltage. In an embodiment, the processor 220 may transmit a training signal and/or a training pattern to the DRAM 210, and the DRAM 210 may perform training using the training pattern in response to the training signal. In an embodiment, the DRAM 210 may transmit training data, which is the result of the training, to the processor 220, and the processor 220 may generate the first eye diagram based on the training data received from the DRAM 210.

In an embodiment, the designated driving voltage may be a preset voltage corresponding to a single component of the DRAM 210. In an embodiment, the driving voltage of the DRAM 210 may be adjustable by the processor 220 below a designated upper limit voltage. For example, when the driving voltage of the DRAM 210 is increased, an eye diagram or a parameter according to training of the DRAM 210 may be enhanced, but conversely, power consumption may be increased. For example, the designated upper limit voltage may be a preset value considering a voltage range and current consumption allowable by the core of the DRAM 210.

For example, the driving voltage of the DRAM 210 may include an interface voltage ($V_{DDI}$), a core voltage ($V_{DD2H}$, $V_{DD2L}$) and an output voltage ($V_{DDO}$). In an embodiment, the interface voltage ($V_{DDI}$) may be set in the range of about 1.7 [V] to 1.95 [V], and may be predesignated as about 1.8 [V]. In an embodiment, the output voltage ($V_{DDO}$) may be fixed at about 0.5 [V] or about 0.3 [V].

In an embodiment, when adjusting the driving voltage of the DRAM 210, the core voltage ($V_{DD2H}$, $V_{DD2L}$) may be adjusted. In an embodiment, adjusting the driving voltage of the DRAM 210 may mean adjusting the core voltage ($V_{DD2H}$, $V_{DD2L}$). For example, the DRAM 210 may be driven with a core voltage ($V_{DD2H}$) in a relatively high frequency band or with a core voltage ($V_{DD2L}$) in a relatively low frequency band based on the driving frequency or may use one core voltage ($V_{DD2H}$, $V_{DD2L}$). In an embodiment, the core voltage ($V_{DD2H}$) in the high frequency band may be set in the range of about 1.01 [V] to 1.12 [V], and may be predesignated as about 1.05 [V]. For example, the core voltage ($V_{DD2L}$) in the low frequency band may be set to be the same as the core voltage ($V_{DD2H}$) in the high frequency band, or may be set in the range of about 0.87 [V] to 0.97 [V], e.g., it may be predesignated as about 0.9 [V].

Figure 3:
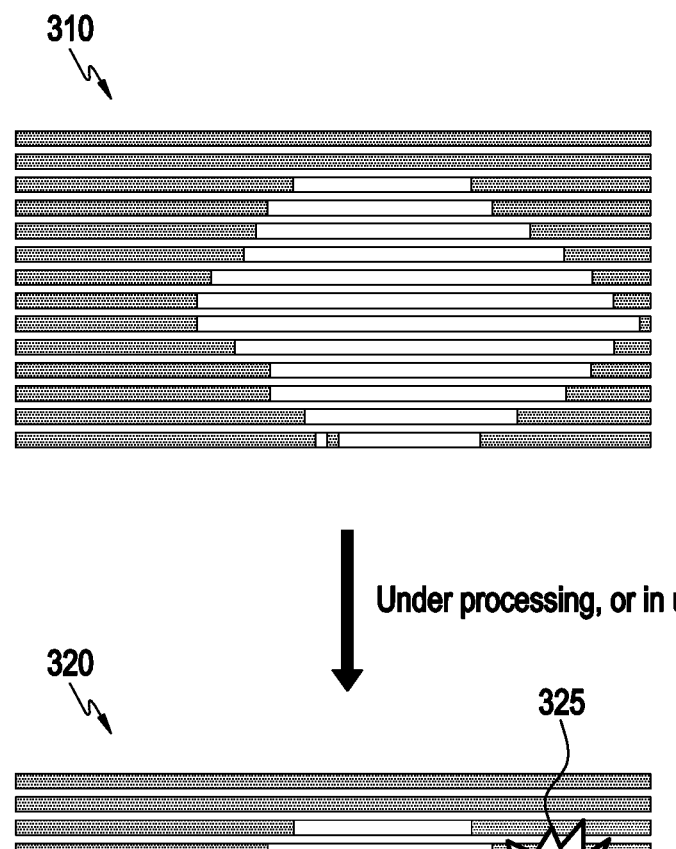
FIG. 3 illustrates an eye diagram corresponding to DRAM in a normal state and an eye diagram corresponding to DRAM in a deteriorated state according to an embodiment of the disclosure.

FIG. 3 illustrates an eye diagram 310 corresponding to DRAM in a normal state and an eye diagram 320 corresponding to DRAM in a deteriorated state according to an embodiment of the disclosure.

Referring to FIG. 3, the electronic device 101 (e.g., the processor 220 of FIG. 2) according to an embodiment may generate an eye diagram by training DRAM (e.g., the DRAM 210 of FIG. 2) with a designated driving voltage.

In an embodiment, the electronic device 101 may generate an eye diagram based on training of the DRAM 210 with a designated driving voltage in a state in which assembly of surface mount devices (SMDs) including the DRAM 210 and the processor 220 is completed on a circuit board. In an embodiment, the electronic device may generate the eye diagram 310 as illustrated in the upper part of FIG. 3 to correspond to the normally operating DRAM 210.

In an embodiment, the DRAM 210 may be deteriorated due to stress such as an additional assembly process in a state in which the DRAM 210 is assembled in the electronic device 101, use of the electronic device 101, staying in a high-temperature state, or electro-static discharge (ESD). In an embodiment, the electronic device 101 may generate an eye diagram 320 as illustrated in the lower part of FIG. 3 in which the margin is reduced (325) in response to the deteriorated DRAM 210.

In an embodiment, the electronic device 101 may determine the deteriorated state of the DRAM 210, based on the eye diagram generated according to the training of the DRAM 210.

Figure 4:
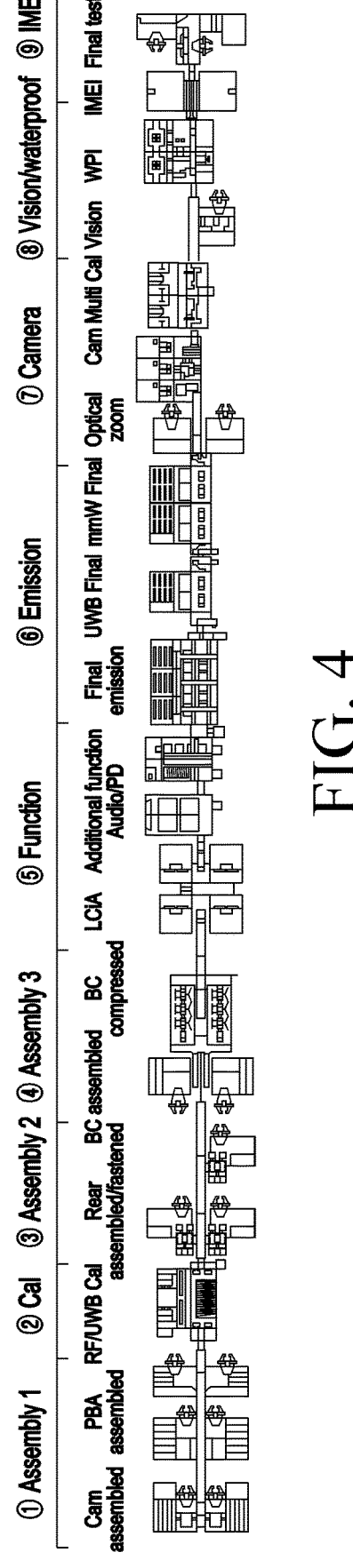
FIG. 4 illustrates a process for assembling an electronic device according to an embodiment of the disclosure.

FIG. 4 illustrates a process for assembling an electronic device according to an embodiment of the disclosure.

Referring to FIG. 4, an electronic device (e.g., the electronic device 101 of FIG. 2) according to an embodiment may be produced by an assembly process including a plurality of assembly, calibration, setting, and inspection steps.

In an embodiment, ① in an assembly 1 step, a camera cam and a circuit board PBA may be assembled into the electronic device 101. In an embodiment, ② in a calibration cal step, the electronic device 101 may perform calibration of communication components (radio frequency (RF) and ultra-wide band (UWB), e.g., communication module 190 of FIG. 1). In an embodiment, ③ in an assembly 2 step, the rear case of the electronic device 101 may be assembled and fastened. In an embodiment, ④ in an assembly 3 step, the electronic device 101 may have a battery charger BC assembled and compressed. In an embodiment, ⑤ in a function setting step, the electronic device 101 may set functions through low cost intelligent automation (LCIA) and set additional functions related to audio and photo diode PD. In an embodiment, ⑥ in an emission step, the electronic device 101 may perform an emission test on a communication component (e.g., UWB or mmW). In an embodiment, ⑦ in a camera step, the electronic device 101 may perform optical zoom-in/zoom-out and camera calibration. In an embodiment, ⑧ in a vision/waterproof step, the electronic device 101 may perform a vision and waterproof test. In an embodiment, ⑨ in an IMEI step, the electronic device 101 may set international mobile equipment identity (IMEI) data.

In an embodiment, the electronic device 101 may generate a first eye diagram, based on training of DRAM (e.g., the DRAM 210 of FIG. 2) with a designated driving voltage, before executing the assembly process of the electronic device 101 described above. In an embodiment, the electronic device 101 may store a first parameter in a designated format corresponding to the generated first eye diagram in memory (e.g., the memory 230 of FIG. 2).

In an embodiment, before assembling the circuit board to the housing, the electronic device 101 may generate a first eye diagram based on training of the DRAM 210 with a designated driving voltage, based on execution of a process program by the processor 220, in a state in which surface mount devices (SMDs) including the DRAM 210 and the processor 220 are assembled onto the circuit board (PBA).

In an embodiment, after the assembling process of the electronic device 101 described above is completed, the electronic device 101 may generate a second eye diagram, based on training of the DRAM 210 with a designated driving voltage. In an embodiment, when the electronic device 101 is booted as the assembly process of the electronic device 101 is completed, the electronic device 101 may generate a second eye diagram based on training of the DRAM 210 with a designated driving voltage.

In an embodiment, when receiving a specific signal related to completion of the assembly process of the electronic device 101, the electronic device 101 may generate the second eye diagram based on training of the DRAM 210 with the designated driving voltage.

In an embodiment, when receiving a user input related to the assembly process of the electronic device 101, the electronic device 101 may generate the second eye diagram based on training of the DRAM 210 at a designated driving voltage.

According to an embodiment, the electronic device 101 may monitor a malfunction associated with the writing or reading of the DRAM 210 and may generate a second eye diagram based on detection of the malfunction. In an embodiment, in the process of transmitting and receiving data to and from the DRAM 210, the processor 220 may monitor a malfunction related to writing or reading of the DRAM 210 on its own, and may generate a second eye diagram based on detection of the malfunction. For example, the malfunction of the DRAM 210 may include a Bitflip in which 1 is written but is read as 0.

In an embodiment, the electronic device 101 may generate a second eye diagram based on a designated period. According to an embodiment, the electronic device 101 may generate a second eye diagram every designated period (e.g., every day, every week, every month, or every year). According to an embodiment, the electronic device 101 may monitor the state of the DRAM 210 or the state of the electronic device 101 every designated period, and may generate the second eye diagram based on detection of a malfunction of the DRAM 210 or a malfunction of the electronic device (e.g., blackout or booting failure).

In an embodiment, when receiving a signal related to a service tool, the electronic device 101 may generate a second eye diagram based on training of the DRAM 210 with a designated driving voltage.

Figure 6:
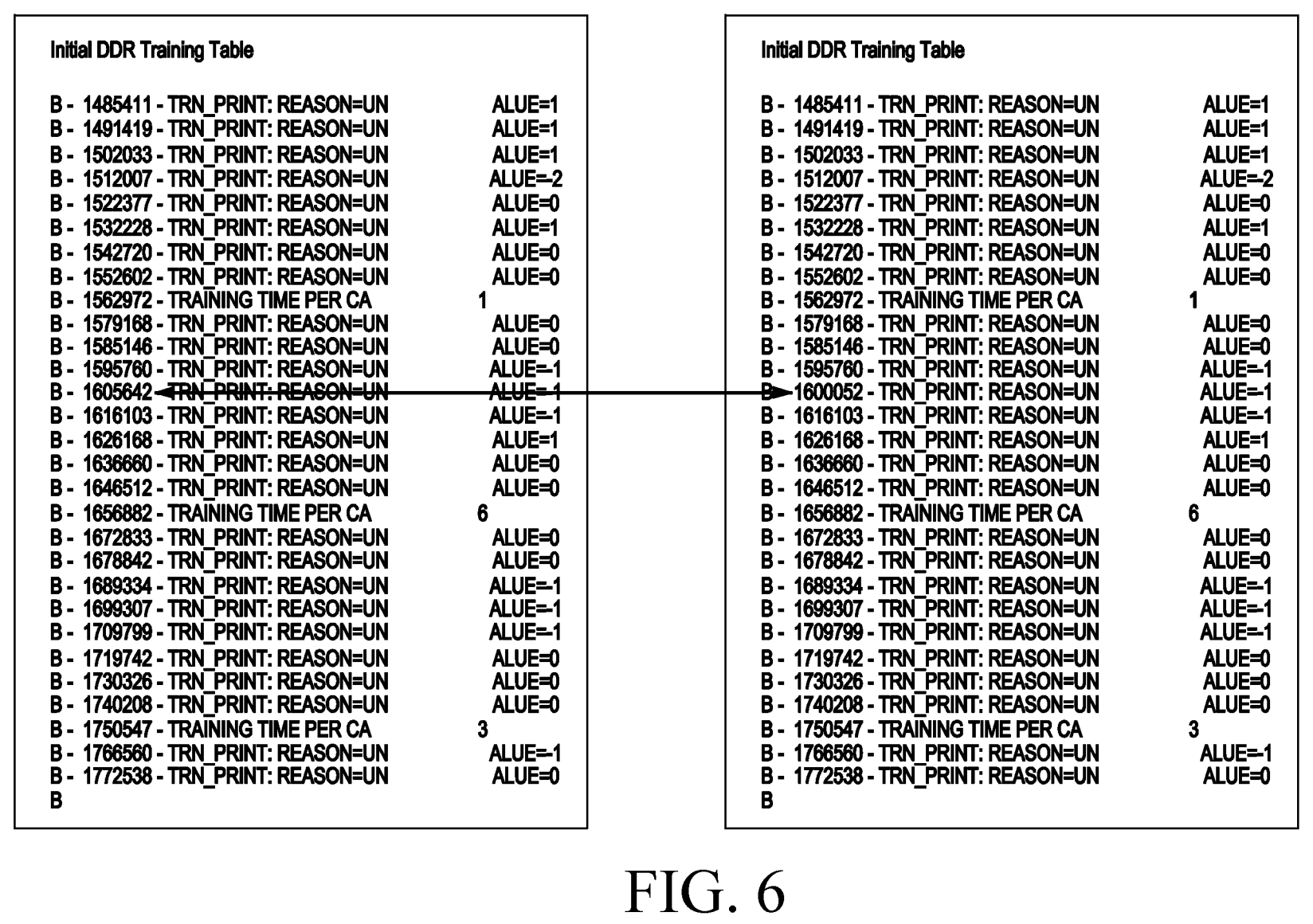

FIG. 5 illustrates a lookup table of a first parameter according to a first eye diagram according to an embodiment of the disclosure. FIG. 6 illustrates a lookup table of a first parameter and a second parameter according to an embodiment of the disclosure.

Referring to FIG. 5, an electronic device (e.g., the electronic device 101 of FIG. 2) according to an embodiment may generate a first eye diagram based on training of DRAM (e.g., the DRAM 210 of FIG. 2) with a designated driving voltage. The electronic device 101 according to an embodiment may identify a first parameter in a designated format from the generated first eye diagram, and may store the identified first parameter in memory (e.g., the memory 230 of FIG. 2). In an embodiment, the electronic device 101 may generate a lookup table of the first parameter corresponding to the first eye diagram and store the generated lookup table in the memory 230.

According to an embodiment, the first parameter or the second parameter in the designated format may include various parameters corresponding to the first eye diagram or the second eye diagram. According to an embodiment, the first parameter or the second parameter in the designated format may include a parameter related to the width or height of the first eye diagram or the second eye diagram.

In an embodiment, the electronic device 101 may compare the first parameter (e.g., the width or height of the first eye diagram) in the designated format with a designated reference parameter value (e.g., a designated width or height). In an embodiment, the electronic device 101 may extract at least some of the at least one first parameter extracted from the first eye diagram, and may compare the extracted at least some with the reference parameter value. In an embodiment, the electronic device 101 may adjust the designated driving voltage based on a result of comparison between the first parameter in the designated format and the designated reference parameter value.

In an embodiment, the designated reference parameter value is a parameter highly effective in determining a defect corresponding to the DRAM, and may have a format of, e.g., width or height. In an embodiment, the electronic device 101 may compare the highest value, the lowest value, and/or the average value of the first parameter extracted from the first eye diagram with the reference parameter values, respectively.

In an embodiment, when the first parameter is less than the designated reference parameter value, the electronic device 101 may increase the designated driving voltage by a designated voltage difference (e.g., about 0.01[V]). In an embodiment, the electronic device 101 may generate the first eye diagram again based on training of the DRAM 210 with the increased driving voltage, and may obtain the first parameter corresponding to the increased driving voltage based on the generated first eye diagram. In an embodiment, the electronic device 101 may repeat the adjustment of the driving voltage by comparing the first parameter corresponding to the increased driving voltage with a designated reference parameter value. According to an embodiment, the electronic device may repeatedly increase the driving voltage so that the first parameter is equal to or greater than a designated reference parameter value.

In an embodiment, when the driving voltage repeatedly increased is greater than or equal to a designated upper limit voltage, the electronic device 101 may stop adjusting the driving voltage. In an embodiment, even if the driving voltage is increased to the designated upper limit voltage, the electronic device 101 may stop adjusting the driving voltage if the first parameter is less than the designated reference parameter value. In an embodiment, even if the driving voltage is increased to the designated upper limit voltage, if the first parameter is less than the designated reference parameter value, the electronic device 101 may determine that the DRAM 210 is deteriorated or defective, and may record data related to the determined deteriorated state of the DRAM 210 in the DRAM 210 or the memory 230.

In an embodiment, when the first parameter corresponding to the designated driving voltage or the increased driving voltage is equal to or greater than the designated reference parameter value, the electronic device 101 may stop adjusting the driving voltage.

Referring to FIG. 6, the electronic device 101 according to an embodiment may generate a second eye diagram based on training of the DRAM 210 with a designated driving voltage.

When a designated condition is met, the electronic device 101 according to an embodiment may train the DRAM 210 with a designated driving voltage and may generate a second eye diagram.

In an embodiment, after the assembling process of the electronic device 101 is completed, the electronic device 101 may generate a second eye diagram, based on training of the DRAM 210 with a designated driving voltage.

According to an embodiment, the electronic device 101 may monitor a malfunction associated with the writing or reading of the DRAM 210 and may generate a second eye diagram based on detection of the malfunction.

In an embodiment, the electronic device 101 may generate a second eye diagram based on a designated period.

According to an embodiment, when receiving a user input or a signal related to a service tool, the electronic device 101 may generate a second eye diagram based on training of the DRAM with a designated driving voltage.

The electronic device 101 according to an embodiment may identify the second parameter in the designated format from the generated second eye diagram, and may store the identified first parameter in the memory 230. In an embodiment, the electronic device 101 may generate a lookup table of the second parameter corresponding to the second eye diagram and store the generated lookup table in the memory 230.

The electronic device 101 according to an embodiment may compare the lookup table of the second parameter or the second parameter with the lookup table of the first parameter or the first parameter stored in the memory 230. In an embodiment, the electronic device 101 may identify whether the difference between the first parameter and the second parameter is greater than or equal to a designated difference value. Here, the designated difference value may be a preset value considering deterioration or defect of the DRAM 210.

When the difference between the first parameter and the second parameter is greater than or equal to the designated difference value, the electronic device 101 according to an embodiment may increase the designated driving voltage. In an embodiment, the electronic device 101 may increase the designated driving voltage by a designated voltage difference (e.g., about 0.01 [V]). For example, the electronic device 101 may repeatedly increase the designated driving voltage (e.g., the core voltage $V_{DD2H}$, $V_{DD2L}$ of the DRAM 210) by about 0.01[V].

The electronic device 101 according to an embodiment may generate the second eye diagram again based on training of the DRAM 210 with the increased driving voltage. The electronic device 101 according to an embodiment may re-identify the second parameter from the re-generated second eye diagram.

The electronic device 101 according to an embodiment may repeatedly adjust the increased driving voltage, based on the second eye diagram or the second parameter corresponding to the increased driving voltage. In an embodiment, the electronic device 101 may compare the second parameter corresponding to the increased driving voltage with the first parameter, and when the difference between the second parameter and the first parameter is greater than or equal to a designated difference value, the electronic device 101 may further increase the increased driving voltage by a designated voltage difference (e.g., about 0.01 [V]).

When the increased driving voltage is greater than or equal to the designated upper limit voltage, the electronic device 101 according to an embodiment may stop adjusting the driving voltage. In an embodiment, the electronic device 101 may stop adjusting the driving voltage when the difference between the second parameter and the first parameter is greater than or equal to the designated difference value even when the driving voltage is increased to the designated upper limit voltage. In an embodiment, even if the driving voltage is increased to the designated upper limit voltage, if the difference between the second parameter and the first parameter is greater than or equal to the designated difference value, the electronic device 101 may determine that the DRAM 210 is deteriorated or defective, and may record data related to the determined state of the DRAM 210 in the DRAM 210 or the memory 230.

In an embodiment, when the driving voltage is increased to the designated upper limit voltage, the electronic device 101 may compare the second parameter corresponding to the upper limit voltage with a designated reference parameter value. For example, the designated reference parameter value may be a parameter that is highly effective in determining a defect corresponding to the DRAM 210. In an embodiment, when the second parameter corresponding to the upper limit voltage is equal to or greater than a designated reference parameter value, the electronic device 101 may determine that the DRAM 210 is normal.

In an embodiment, when the difference between the first parameter and the second parameter corresponding to the designated driving voltage or the increased driving voltage is less than the designated difference value, the electronic device 101 may stop adjusting the driving voltage.

Figure 7A:
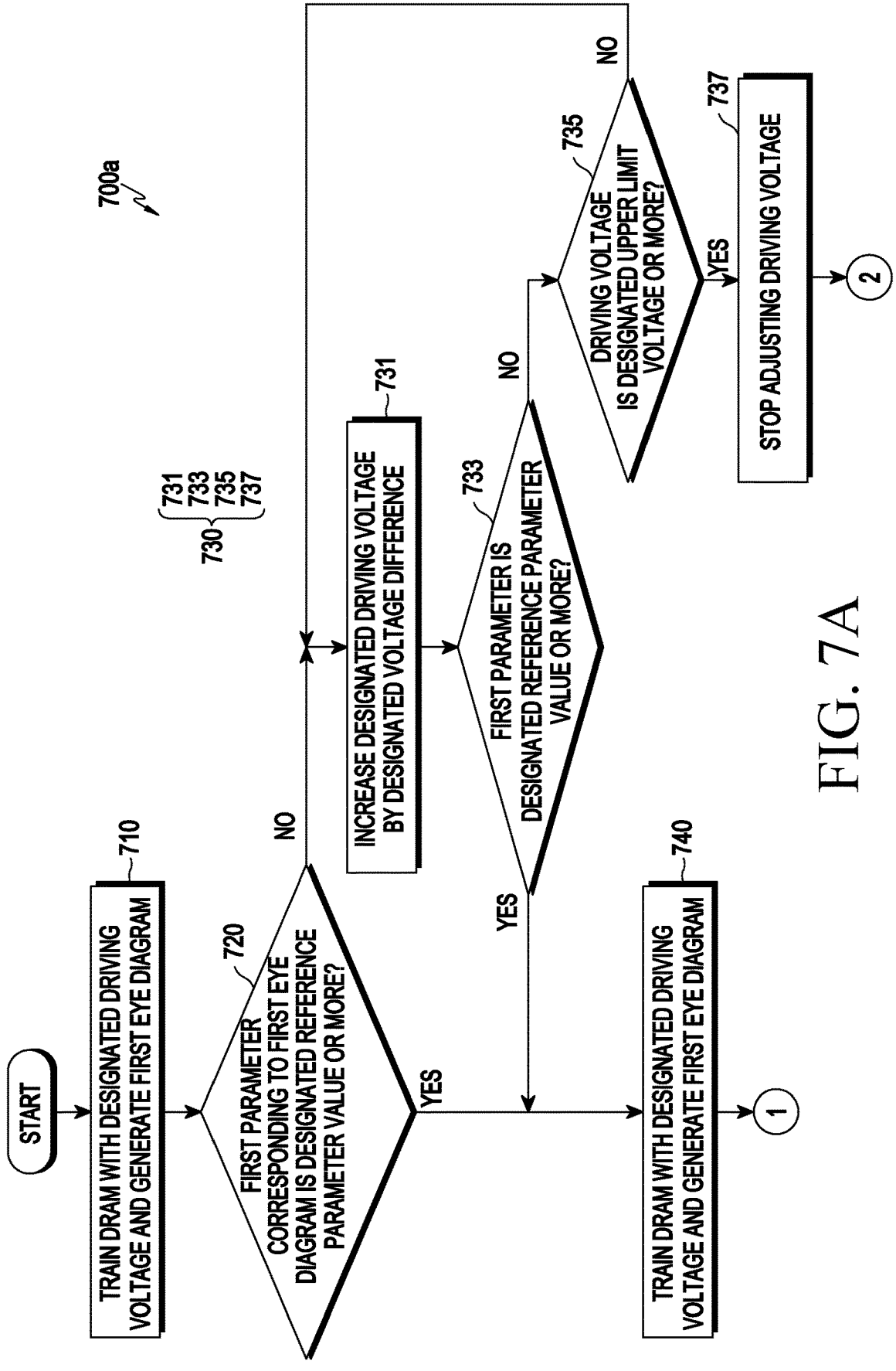
FIGS. 7A and 7B are flowcharts illustrating a method for operating an electronic device according to various embodiments of the disclosure.
Figure 7B:
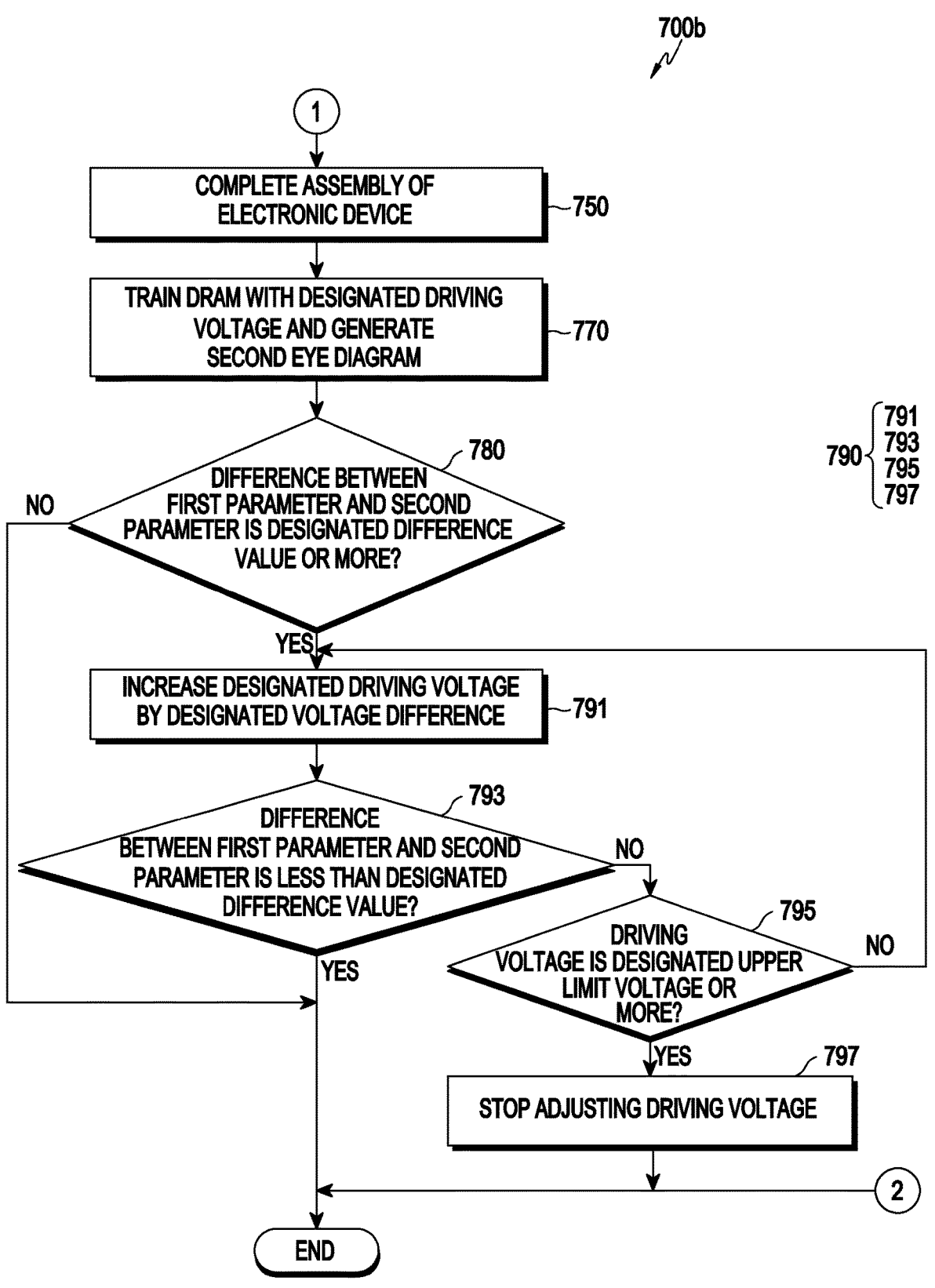

FIGS. 7A and 7B are flowcharts 700*a* and 700*b* illustrating a method for operating an electronic device 101 according to various embodiments of the disclosure.

Referring to FIGS. 7A and 7B, in operation 710, the electronic device 101 according to an embodiment may train the DRAM 210 with a designated driving voltage and may generate a first eye diagram corresponding to the designated driving voltage. In an embodiment, the electronic device 101 may generate a first eye diagram in a state in which the DRAM 210 and/or the processor is assembled.

In operation 720, the electronic device 101 according to an embodiment may compare the first parameter corresponding to the first eye diagram with a designated reference parameter value. In an embodiment, the electronic device 101 may determine whether the first parameter in the designated format is greater than or equal to a designated reference parameter value.

For example, the first parameter in the designated format may include a parameter related to the width or height of the first eye diagram. According to an embodiment, in operation 720, the electronic device 101 may extract at least some of the first parameters of the first eye diagram, and may compare the extracted at least some with a reference parameter value. For example, the electronic device 101 may identify whether all of the extracted at least some of the first parameters are greater than or equal to the reference parameter value.

In operation 730, the electronic device 101 according to an embodiment may adjust the designated driving voltage, based on a result of comparison between the first parameter and the designated reference parameter value. When the first parameter is greater than or equal to the designated reference parameter value (no in operation 720), the electronic device 101 according to an embodiment may adjust the designated driving voltage in operation 730.

When the first parameter is equal to or greater than the designated reference parameter value (no in operation 720), the electronic device 101 according to an embodiment may increase the designated driving voltage by a designated voltage difference (e.g., about 0.01[V]) in operation 731. For example, the electronic device 101 may repeatedly increase the designated driving voltage (e.g., the core voltage $V_{DD2H}$, $V_{DD2L}$ of the DRAM 210) by about 0.01 [V].

In an embodiment, the electronic device 101 may store the second parameter in the designated format corresponding to the second eye diagram in the memory 230. In an embodiment, the electronic device 101 may re-generate the first eye diagram corresponding to the increased driving voltage and may re-extract the first parameter corresponding to the re-generated first eye diagram.

When the first parameter corresponding to the increased driving voltage is less than the designated reference parameter value (no in operation 733), the electronic device 101 according to an embodiment may identify whether the driving voltage is greater than or equal to the designated upper limit voltage in operation 735.

When the driving voltage is greater than or equal to the designated upper limit voltage (yes in operation 735), the electronic device 101 according to an embodiment may stop adjusting the driving voltage in operation 737. In an embodiment, the electronic device 101 may determine that the DRAM 210 is deteriorated or defective, and may record data related to the determined state of the DRAM 210 in the DRAM 210 or the memory 230.

In operation 731, the electronic device 101 according to an embodiment may repeat adjustment of the increased driving voltage, based on the first eye diagram or the first parameter corresponding to the increased driving voltage. When the increased driving voltage is less than the designated upper limit voltage (no in operation 735), the electronic device 101 according to an embodiment may repeat adjustment of the increased driving voltage in operation 731.

When the first parameter corresponding to the designated driving voltage is equal to or greater than the designated reference parameter value (yes in operation 720) or when the first parameter corresponding to the increased driving voltage is equal to or greater than the designated reference parameter value (yes in operation 733), the electronic device 101 according to an embodiment may store the first parameter value corresponding to the first eye diagram in the memory 230 in operation 740.

When the first parameter corresponding to the designated driving voltage is equal to or greater than the designated reference parameter value (yes in operation 720) or when the first parameter corresponding to the increased driving voltage is equal to or greater than the designated reference parameter value (yes in operation 733), the electronic device 101 according to an embodiment may not adjust the designated driving voltage or may stop adjusting the designated driving voltage in operation 730.

The electronic device 101 according to an embodiment may complete assembly of the electronic device 101 in operation 750. In an embodiment, the electronic device 101 may be assembled according to a series of assembly processes, and may train the DRAM 210 with a designated driving voltage and generate a second eye diagram in operation 770, based on completion of the assembly.

In an embodiment, when the electronic device 101 is booted after the assembly of the electronic device 101 is completed, the electronic device 101 may generate a second eye diagram. In an embodiment, when receiving a specific signal related to completion of assembly of the electronic device 101, the electronic device 101 may generate a second eye diagram. In an embodiment, the electronic device 101 may generate a second eye diagram when receiving a user input related to assembly completion of the electronic device 101.

In an embodiment, the DRAM 210 may be deteriorated due to stress such as an additional assembly process in a state of being assembled to the electronic device 101, use of the electronic device 101, staying in a high-temperature state, or electro-static discharge (ESD). In an embodiment, the electronic device 101 may determine the deteriorated state of the DRAM 210, based on the second eye diagram generated according to the training of the DRAM 210.

According to an embodiment, when a failure occurs in the electronic device 101 as an error or malfunction occurs in the state of the DRAM 210, the electronic device 101 may generate a second eye diagram. For example, the electronic device 101 may generate the second eye diagram based on the use of a service tool in a service center or the execution of a designated program.

In operation 780, the electronic device 101 according to an embodiment may compare the second parameter in the designated format corresponding to the generated second eye diagram with the first parameter stored in the memory 230. According to an embodiment, in operation 780, the electronic device 101 may identify whether the difference between the first parameter and the second parameter is greater than or equal to a designated difference value. For example, the electronic device 101 may compare the extracted at least some of the first parameters with the extracted at least some of the second parameters, respectively, and may identify whether each difference value is greater than or equal to a designated difference value.

In an embodiment, the electronic device 101 may store the second parameter in the designated format corresponding to the second eye diagram in the memory 230. In an embodiment, when the difference between the first parameter and the second parameter is greater than or equal to the designated difference value (yes in operation 780), the electronic device 101 may store the lookup table of the second parameter in the memory 230.

According to an embodiment, the electronic device 101 may adjust the designated driving voltage in operation 790, based on a result of comparing the first parameter and the second parameter. In an embodiment, when the difference between the first parameter and the second parameter is greater than or equal to the designated difference value (yes in operation 780), the electronic device 101 may adjust the designated driving voltage in operation 790.

In an embodiment, when the difference between the first parameter and the second parameter is greater than or equal to the designated difference value (yes in operation 780), in operation 791, the electronic device 101 may increase the designated driving voltage by a designated voltage difference (e.g., about 0.01[V]). For example, the electronic device 101 may repeatedly increase the designated driving voltage (e.g., the core voltage $V_{DD2H}$, $V_{DD2L}$ of the DRAM 210) by about 0.01[V].

According to an embodiment, in operation 793, the electronic device 101 may identify whether the difference between the first parameter and the second parameter is less than designated difference value. In an embodiment, the electronic device 101 may re-generate the second eye diagram based on the increased driving voltage and may re-extract the second parameter corresponding to the second eye diagram.

In an embodiment, when the difference between the first parameter and the second parameter corresponding to the increased driving voltage is greater than or equal to the designated difference value (no in operation 793), the electronic device 101 may identify whether the increased driving voltage is greater than or equal to the designated upper limit voltage in operation 795. In an embodiment, when the difference between the first parameter and the second parameter is greater than or equal to the designated difference value (yes in operation 793), in operation 795, the electronic device 101 may increase the designated driving voltage by a designated voltage difference (e.g., about 0.01[V]).

When the increased driving voltage is greater than or equal to the designated upper limit voltage (yes in operation 795), the electronic device 101 according to an embodiment may stop adjusting the driving voltage in operation 797. In an embodiment, the electronic device 101 may determine that the DRAM 210 is deteriorated or defective, and may record data related to the determined state of the DRAM 210 in the DRAM 210 or the memory 230.

When the increased driving voltage is greater than or equal to the designated upper limit voltage, the electronic device 101 according to an embodiment may compare the second parameter extracted from the second eye diagram corresponding to the designated upper limit voltage with a designated reference parameter value. In an embodiment, even if the difference between the second parameter corresponding to the designated upper limit voltage and the first parameter is greater than or equal to the designated difference value, if the second parameter is greater than or equal to the reference parameter, the electronic device 101 may determine that the DRAM 210 is normal.

In operation 791, the electronic device 101 according to an embodiment may repeat adjustment of the increased driving voltage, based on the second eye diagram or the second parameter corresponding to the increased driving voltage. When the increased driving voltage is less than the designated upper limit voltage (no in operation 795), the electronic device 101 according to an embodiment may repeat adjustment of the increased driving voltage in operation 791.

In an embodiment, when the difference between the first parameter and the second parameter corresponding to the designated driving voltage is less than the designated difference value (no in operation 780), or when the difference between the first parameter and the second parameter corresponding to the increased driving voltage is less than the designated difference value (yes in operation 793), the electronic device 101 may not adjust the driving voltage or may stop adjusting the driving voltage.

Figure 8:
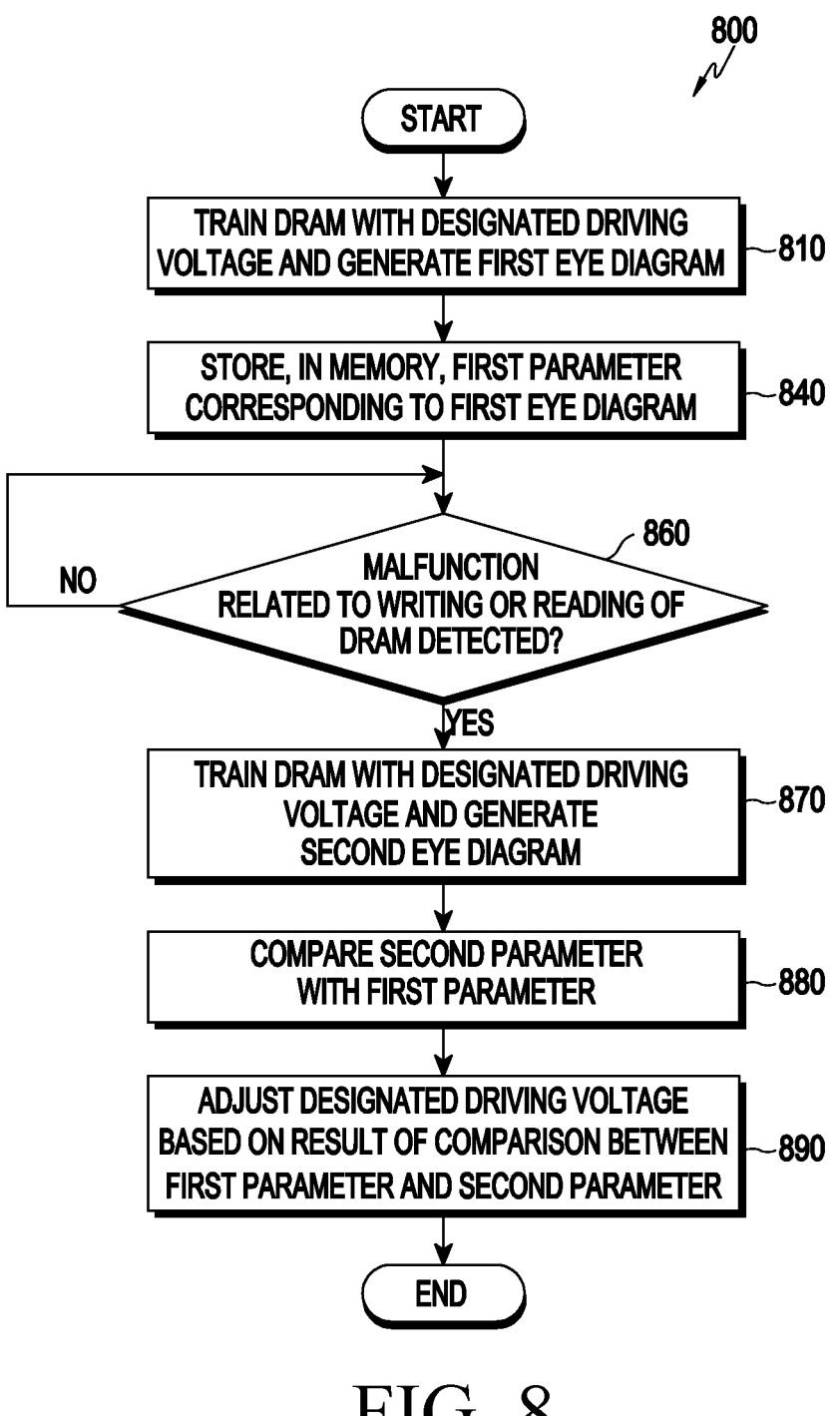
FIG. 8 is a flowchart illustrating a method for operating an electronic device according to an embodiment of the disclosure.

FIG. 8 is a flowchart 800 illustrating a method for operating an electronic device 101 according to an embodiment of the disclosure.

Referring to FIG. 8, in operation 810, the electronic device 101 according to an embodiment may train the DRAM 210 with a designated driving voltage, and may generate a first eye diagram based thereon.

In an embodiment, the electronic device 101 may compare the first parameter corresponding to the first eye diagram with a designated reference parameter value. In an embodiment, the electronic device 101 may adjust the designated driving voltage based on a result of comparison between the first parameter and the designated reference parameter value.

In operation 840, the electronic device 101 according to an embodiment may store a first parameter value corresponding to the first eye diagram in the memory 230.

The electronic device 101 according to an embodiment may monitor a malfunction associated with writing or reading of the DRAM 210. In operation 860, the electronic device 101 according to an embodiment may identify whether a malfunction related to writing or reading of the DRAM 210 is detected.

When no malfunction related to writing or reading of the DRAM 210 is detected (no in operation 860), the electronic device 101 according to an embodiment may continuously monitor the malfunction related to writing or reading of the DRAM 210.

When a malfunction related to writing or reading of the DRAM 210 is detected (yes in operation 860), in operation 870, the electronic device 101 according to an embodiment may train the DRAM 210 with a designated driving voltage and may generate a second eye diagram based thereon.

In operation 880, the electronic device 101 according to an embodiment may compare the second parameter with the stored first parameter.

In operation 890, the electronic device 101 according to an embodiment may adjust the designated driving voltage, based on a result of comparing the first parameter and the second parameter. For example, when the difference between the first parameter and the second parameter is greater than or equal to the designated difference value, the electronic device 101 may increase the designated driving voltage.

When the designated driving voltage is increased, the electronic device 101 according to an embodiment may train the DRAM 210 with the adjusted driving voltage, and may generate the second eye diagram again based thereon. In an embodiment, the electronic device 101 may compare the second parameter corresponding to the re-generated second eye diagram with the stored first parameter.

Although the configuration of the operation method of the electronic device 101 associated with FIG. 8 is not specifically described, the specific operation method described with reference to FIGS. 7A, and 7B may be applied.

Figure 9:
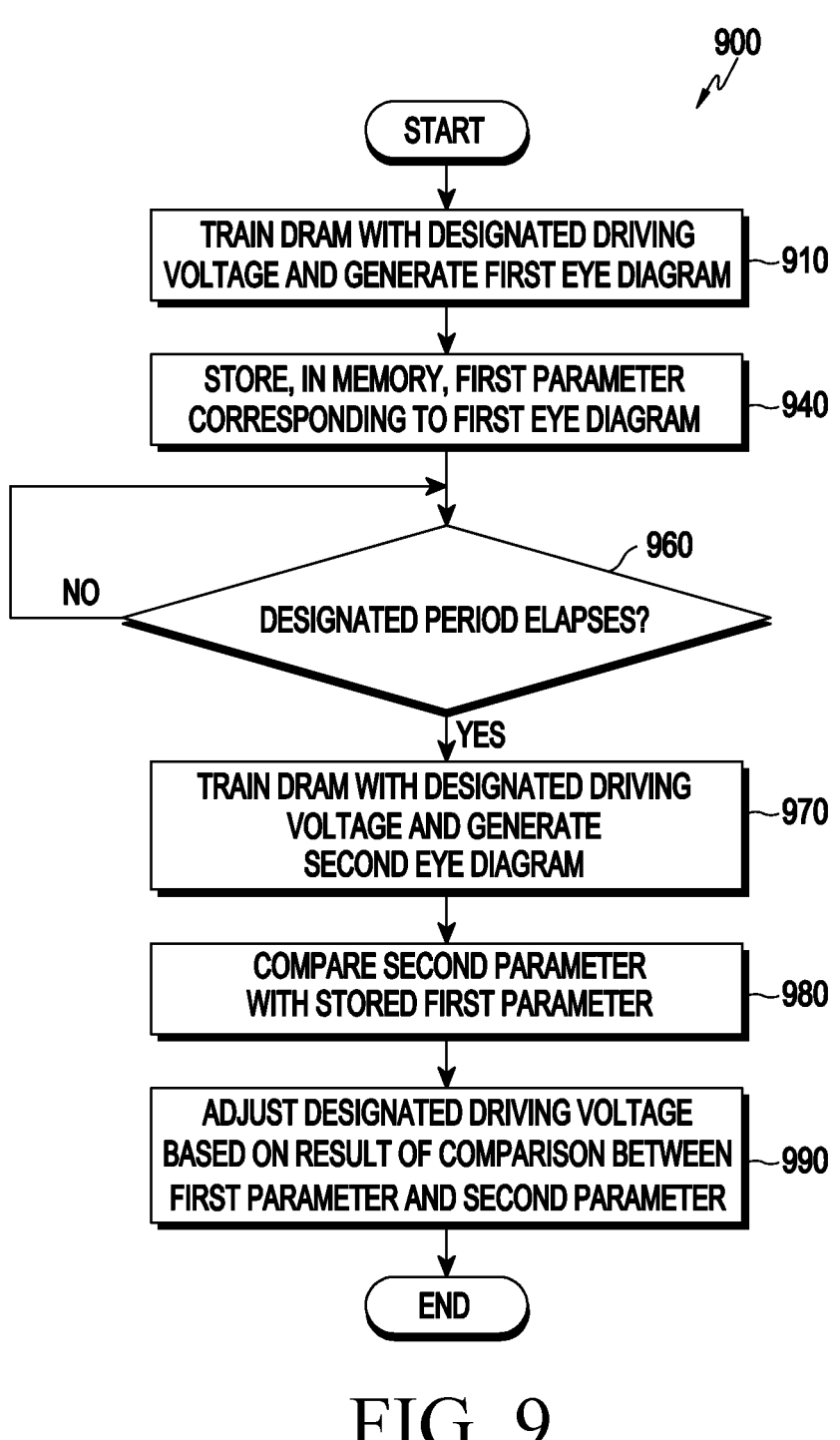
FIG. 9 is a flowchart illustrating a method for operating an electronic device according to an embodiment of the disclosure.

FIG. 9 is a flowchart 900 illustrating a method for operating an electronic device 101 according to an embodiment of the disclosure.

Referring to FIG. 9, in operation 910, the electronic device 101 according to an embodiment may train the DRAM 210 with a designated driving voltage, and may generate a first eye diagram based thereon.

In an embodiment, the electronic device 101 may compare the first parameter corresponding to the first eye diagram with a designated reference parameter value. In an embodiment, the electronic device 101 may adjust the designated driving voltage based on a result of comparison between the first parameter and the designated reference parameter value.

In operation 940, the electronic device 101 according to an embodiment may store a first parameter value corresponding to the first eye diagram in the memory 230.

In operation 960, the electronic device 101 according to an embodiment may identify whether a designated period has elapsed. Here, the designated cycle may be, e.g., one hour, one day, one month, or one year. The electronic device 101 according to an embodiment may train the DRAM 210 with a designated driving voltage and generate a second eye diagram, based on the designated period.

When the designated period has not elapsed (no in operation 960), the electronic device 101 according to an embodiment may continuously monitor whether the designated period has elapsed.

When the designated period elapses (yes in operation 960), in operation 970, the electronic device 101 according to an embodiment may train the DRAM 210 with a designated driving voltage and may generate a second eye diagram based thereon. The electronic device 101 according to an embodiment may train the DRAM 210 with a designated driving voltage according to a designated periodic interval, and may generate a second eye diagram based thereon.

When the designated period elapses (yes in operation 960), the electronic device 101 according to an embodiment may monitor whether an error or malfunction (e.g., blackout or booting failure) is detected in the state of the DRAM 210 or the state of the electronic device 101. According to an embodiment, the electronic device 101 may generate the second eye diagram based on detection of an error or malfunction in the state of the DRAM 210 or the state of the electronic device 101.

In operation 980, the electronic device 101 according to an embodiment may compare the second parameter with the stored first parameter.

In operation 990, the electronic device 101 according to an embodiment may adjust the designated driving voltage, based on a result of comparing the first parameter and the second parameter. For example, when the difference between the first parameter and the second parameter is greater than or equal to the designated difference value, the electronic device 101 may increase the designated driving voltage.

When the designated driving voltage is increased, the electronic device 101 according to an embodiment may train the DRAM 210 with the adjusted driving voltage, and may generate the second eye diagram again based thereon. In an embodiment, the electronic device 101 may compare the second parameter corresponding to the re-generated second eye diagram with the stored first parameter.

Although the configuration of the operation method of the electronic device 101 associated with FIG. 9 is not specifically described, the specific operation method described with reference to FIGS. 7A and 7B may be applied.

An electronic device 101 according to an embodiment of the disclosure may comprise dynamic random access memory (DRAM) 210, memory 230 or 130 storing instructions, and at least one processor. The instructions, when executed by the at least one processor 220 or 120, may cause the electronic device (101) to generate a first eye diagram based on training of the DRAM 210 with a driving voltage. The instructions, when executed by the at least one processor 220 or 120, may cause the electronic device (101) to identify a first parameter in a designated format corresponding to the generated first eye diagram. The instructions, when executed by the at least one processor 220 or 120, may cause the electronic device (101) to generate a second eye diagram based on training the of DRAM 210 with the driving voltage. The instructions, when executed by the at least one processor 220 or 120, may cause the electronic device (101) to compare the identified first parameter with a second parameter in the designated format corresponding to the generated second eye diagram. The instructions, when executed by the at least one processor 220 or 120, may cause the electronic device (101) to adjust the driving voltage based on a result of the comparison between the first parameter and the second parameter.

In the electronic device 101 according to an embodiment, the first parameter or the second parameter in the designated format may be configured to include a parameter related to a width or height of the first eye diagram or the second eye diagram.

In the electronic device 101 according to an embodiment, The instructions, when executed by the at least one processor 220 or 120, may cause the electronic device (101) to compare the first parameter with a designated reference parameter value. The instructions, when executed by the at least one processor 220 or 120, may cause the electronic device (101) to adjust the driving voltage based on a result of the comparison between the first parameter and the designated reference parameter value.

In the electronic device 101 according to an embodiment, The instructions, when executed by the at least one processor 220 or 120, may cause the electronic device (101) to, as at least part of adjusting the driving voltage, increase the driving voltage by a designated voltage difference based on the result of the comparison between the first parameter and the designated reference parameter value, repeat the adjustment of the driving voltage based on the first parameter or the first eye diagram corresponding to the increased driving voltage, and when the increased driving voltage is a designated upper limit voltage or more, stop adjusting the driving voltage.

In the electronic device 101 according to an embodiment, The instructions, when executed by the at least one processor 220 or 120, may cause the electronic device (101) to, as at least part of adjusting the driving voltage, when a difference between the first parameter and the second parameter is a designated difference value or more, increase the driving voltage.

In the electronic device 101 according to an embodiment, The instructions, when executed by the at least one processor 220 or 120, may cause the electronic device (101) to, as at least part of adjusting the driving voltage, increase the driving voltage by a designated voltage difference based on the result of the comparison between the first parameter and the second parameter, and repeat the adjustment of the driving voltage based on the second parameter or the second eye diagram corresponding to the increased driving voltage.

In the electronic device 101 according to an embodiment, The instructions, when executed by the at least one processor 220 or 120, may cause the electronic device (101) to, as at least part of adjusting the driving voltage, when the increased driving voltage is a designated upper limit voltage or more, stop adjusting the driving voltage.

In the electronic device 101 according to an embodiment, The instructions, when executed by the at least one processor 220 or 120, may cause the electronic device (101) to, as at least part of generating the second eye diagram, generate the second eye diagram based on assembly of the electronic device 101 being completed.

In the electronic device 101 according to an embodiment, The instructions, when executed by the at least one processor 220 or 120, may cause the electronic device (101) to monitor a malfunction related to writing or reading of the DRAM 210, and as at least part of generating the second eye diagram, generate the second eye diagram based on detection of the malfunction.

In the electronic device 101 according to an embodiment, The instructions, when executed by the at least one processor 220 or 120, may cause the electronic device (101) to, as at least part of generating the second eye diagram, generate the second eye diagram based on a designated period.

A method performed by an electronic device according to an embodiment of the disclosure may comprise generating 710, 810, or 910 a first eye diagram based on training dynamic random access memory (DRAM) with a driving voltage. The method performed by the electronic device according to an embodiment may comprise identifying a first parameter in a designated format corresponding to the generated first eye diagram. The method performed by the electronic device according to an embodiment may comprise generating 770, 870, or 970 a second eye diagram based on training the DRAM 210 with the driving voltage. The method performed by the electronic device according to an embodiment may comprise comparing 780, 880, or 980 the identified first parameter with a second parameter in the designated format corresponding to the generated second eye diagram. The method performed by the electronic device according to an embodiment may comprise adjusting 790, 890, or 990 the driving voltage based on a result of the comparison between the first parameter and the second parameter.

In the method performed by the electronic device according to an embodiment, the first parameter or the second parameter in the designated format may be configured to include a parameter related to a width or height of the first eye diagram or the second eye diagram.

The method performed by the electronic device according to an embodiment may further comprise comparing 720 the first parameter with a designated reference parameter value, and adjusting 730 the driving voltage based on a result of the comparison between the first parameter and the designated reference parameter value.

In the method performed by the electronic device according to an embodiment, adjusting 730 the driving voltage may include increasing 731 the driving voltage by a designated voltage difference based on the result of the comparison between the first parameter and the designated reference parameter value, repeating 733, 731 the adjustment of the driving voltage based on the first parameter or the first eye diagram corresponding to the increased driving voltage, and when the increased driving voltage is a designated upper limit voltage or more 735, stopping 737 adjusting the driving voltage.

In the method performed by the electronic device according to an embodiment, adjusting 790, 890, or 990 the driving voltage may increase the driving voltage when a difference between the first parameter and the second parameter is a designated difference value or more.

In the method performed by the electronic device according to an embodiment, adjusting 790, 890, or 990 the driving voltage may include increasing 791 the driving voltage by a designated voltage difference based on the result of the comparison between the first parameter and the second parameter, and repeating 793 or 791 the adjustment of the driving voltage based on the second parameter or the second eye diagram corresponding to the increased driving voltage.

In the method performed by the electronic device according to an embodiment, adjusting 790, 890, or 990 the driving voltage may further include, when the increased driving voltage is a designated upper limit voltage or more 795, stopping 797 adjusting the driving voltage.

In the method performed by the electronic device according to an embodiment, generating the second eye diagram may generate the second eye diagram based on assembly of the electronic device 101 being completed 750.

The method performed by the electronic device according to an embodiment may further comprise monitoring 860 a malfunction related to writing or reading of the DRAM 210. In the method for operating the electronic device according to an embodiment, generating 870 the second eye diagram may generate the second eye diagram based on detection of the malfunction.

In the method performed by the electronic device according to an embodiment, generating 970 the second eye diagram may generate the second eye diagram based on a designated period 960.

A non-transitory computer readable medium 230 or 130 storing instructions that, when executed by at least one processor 220 or 120 of an electronic device 101, may cause the electronic device 101 to generate a first eye diagram based on training of DRAM 210 with a driving voltage. The instructions, when executed by the at least one processor 220 or 120, may cause the electronic device 101 to identify a first parameter in a designated format corresponding to the generated first eye diagram. The instructions, when executed by the at least one processor 220 or 120, may cause the electronic device 101 to generate a second eye diagram based on training of the DRAM 210 with the driving voltage. The instructions, when executed by the at least one processor 220 or 120, may cause the electronic device 101 to compare the identified first parameter with a second parameter in the designated format corresponding to the generated second eye diagram. The instructions, when executed by the at least one processor 220 or 120, may cause the electronic device 101 to adjust the driving voltage based on a result of the comparison between the first parameter and the second parameter.

The electronic device according to an embodiment may be one of various types of electronic devices. The electronic devices may include, for example, a portable communication device (e.g., a smart phone), a computer device, a portable multimedia device, a portable medical device, a camera, an electronic device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

An embodiment of the disclosure may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The storage medium readable by the machine may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities. Some of the plurality of entities may be separately disposed in different components. According to an embodiment, one or more of the above-described components may be omitted, or one or more other components may be added. Alternatively or Further, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Any such software may be stored in the form of volatile or non-volatile storage such as, for example, a storage device like read only memory (ROM), whether erasable or rewritable or not, or in the form of memory such as, for example, random access memory (RAM), memory chips, device or integrated circuits or on an optically or magnetically readable medium such as, for example, a compact disk (CD), digital versatile disc (DVD), magnetic disk or magnetic tape or the like. It will be appreciated that the storage devices and storage media are various embodiments of non-transitory machine-readable storage that are suitable for storing a program or programs comprising instructions that, when executed, implement various embodiments of the present disclosure. Accordingly, various embodiments provide a program comprising code for implementing apparatus or a method as claimed in any one of the claims of this specification and a non-transitory machine-readable storage storing such a program.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

dynamic random access memory (DRAM);

memory storing instructions; and at least one processor, wherein the instructions, when executed by the at least one processor, cause the electronic device to:

generate a first eye diagram based on training of the DRAM with a driving voltage, identify a first parameter in a designated format corresponding to the generated first eye diagram, generate a second eye diagram based on training of the DRAM with the driving voltage, compare the identified first parameter with a second parameter in the designated format corresponding to the generated second eye diagram, and adjust the driving voltage based on a result of the comparison between the first parameter and the second parameter.

2. The electronic device of claim 1, wherein the first parameter or the second parameter in the designated format includes a parameter related to a width or height of the first eye diagram or the second eye diagram.

3. The electronic device of claim 1, wherein the instructions, when executed by the at least one processor, cause the electronic device to:

compare the first parameter with a designated reference parameter value, and adjust the driving voltage based on a result of the comparison between the first parameter and the designated reference parameter value.

4. The electronic device of claim 3, wherein the instructions, when executed by the at least one processor, cause the electronic device to:

as at least part of adjusting the driving voltage:

increase the driving voltage by a designated voltage difference based on the result of the comparison between the first parameter and the designated reference parameter value, repeat the adjustment of the driving voltage based on the first parameter or the first eye diagram corresponding to the increased driving voltage, and when the increased driving voltage is a designated upper limit voltage or more, stop adjusting the driving voltage.

5. The electronic device of claim 1, wherein the instructions, when executed by the at least one processor, cause the electronic device to:

as at least part of adjusting the driving voltage, when a difference between the first parameter and the second parameter is a designated difference value or more, increase the driving voltage.

6. The electronic device of claim 1, wherein the instructions, when executed by the at least one processor, cause the electronic device to:

as at least part of adjusting the driving voltage:

increase the driving voltage by a designated voltage difference based on the result of the comparison between the first parameter and the second parameter, and repeat the adjustment of the driving voltage based on the second parameter or the second eye diagram corresponding to the increased driving voltage.

7. The electronic device of claim 6, wherein the instructions, when executed by the at least one processor, cause the electronic device to:

as at least part of adjusting the driving voltage, when the increased driving voltage is a designated upper limit voltage or more, stop adjusting the driving voltage.

8. The electronic device of claim 1, wherein the instructions, when executed by the at least one processor, cause the electronic device to:

as at least part of generating the second eye diagram, generate the second eye diagram based on assembly of the electronic device being completed.

9. The electronic device of claim 1, wherein the instructions, when executed by the at least one processor, cause the electronic device to:

monitor a malfunction related to writing or reading of the DRAM, and as at least part of generating the second eye diagram, generate the second eye diagram based on detection of the malfunction.

10. The electronic device of claim 1, wherein the instructions, when executed by the at least one processor, cause the electronic device to:

as at least part of generating the second eye diagram, generate the second eye diagram based on a designated period.

11. A method performed by an electronic device, the method comprising:

generating a first eye diagram based on training dynamic random access memory (DRAM) with a driving voltage;

identifying a first parameter in a designated format corresponding to the generated first eye diagram;

generating a second eye diagram based on training the DRAM with the driving voltage;

comparing the identified first parameter with a second parameter in the designated format corresponding to the generated second eye diagram; and adjusting the driving voltage based on a result of the comparison between the first parameter and the second parameter.

12. The method of claim 11, wherein the first parameter or the second parameter in the designated format includes a parameter related to a width or height of the first eye diagram or the second eye diagram.

13. The method of claim 11, further comprising:

comparing the first parameter with a designated reference parameter value; and adjusting the driving voltage based on a result of the comparison between the first parameter and the designated reference parameter value.

14. The method of claim 13, wherein the adjusting of the driving voltage includes:

increasing the driving voltage by a designated voltage difference based on the result of the comparison between the first parameter and the designated reference parameter value;

repeating the adjustment of the driving voltage based on the first parameter or the first eye diagram corresponding to the increased driving voltage; and when the increased driving voltage is a designated upper limit voltage or more, stopping adjusting the driving voltage.

15. The method of claim 11, wherein the adjusting of the driving voltage increases the driving voltage when a difference between the first parameter and the second parameter is a designated difference value or more.

16. The method of claim 11, wherein the adjusting of the driving voltage includes:

increasing the driving voltage by a designated voltage difference based on the result of the comparison between the first parameter and the second parameter; and repeating the adjustment of the driving voltage based on the second parameter or the second eye diagram corresponding to the increased driving voltage.

17. The method of claim 16, wherein the adjusting of the driving voltage includes:

when the increased driving voltage is a designated upper limit voltage or more, stopping adjusting the driving voltage.

18. The method of claim 11, wherein the generating of the second eye diagram generates the second eye diagram based on assembly of the electronic device being completed.

19. The method of claim 11, further comprising:

monitoring a malfunction related to writing or reading of the DRAM, wherein the generating of the second eye diagram generates the second eye diagram based on detection of the malfunction.

20. A non-transitory computer readable medium storing instructions that, when executed by at least one processor of an electronic device, cause the electronic device to:

generate a first eye diagram based on training of dynamic random access memory (DRAM) with a driving voltage;

identify a first parameter in a designated format corresponding to the generated first eye diagram;

generate a second eye diagram based on training of the DRAM with the driving voltage;

compare the identified first parameter with a second parameter in the designated format corresponding to the generated second eye diagram; and adjust the driving voltage based on a result of the comparison between the first parameter and the second parameter.

* * * * *